US005522957A

United States Patent [19]
Weling et al.

[11] Patent Number: 5,522,957
[45] Date of Patent: Jun. 4, 1996

[54] METHOD FOR LEAK DETECTION IN ETCHING CHAMBERS

[75] Inventors: Milind Weling, San Jose; Calvin T. Gabriel, Cupertino; Vivek Jain, Milpitas; Dipankar Pramanik, Cupertino, all of Calif.

[73] Assignee: VLSI Technology, Inc., San Jose, Calif.

[21] Appl. No.: 171,491

[22] Filed: Dec. 22, 1993

[51] Int. Cl.$^6$ .................................................. H01L 21/306
[52] U.S. Cl. .................................... 156/626.1; 156/625.1; 156/643.1; 156/627.1; 156/345; 437/8; 437/228; 437/7; 148/DIG. 162
[58] Field of Search ........................... 156/625.1, 626.1, 156/643.1, 345.1, 627.1; 437/8, 228, 7; 148/DIG. 162

[56] References Cited

PUBLICATIONS

H. A. Khoury, "Real–time Etch Plasma Monitor System", IBM Tech. Dis. Bulletin, vol. 250, No. 11A, Apr. 1983, pp. 5721–5723.
W. R. Rozich, "Determining Trace . . . Plasma Etching System", IBM Tech. Dis. Bull., vol. 20, No. 3, p. 1021, Aug. 1977.

*Primary Examiner*—George Fourson
*Assistant Examiner*—Long Pham
*Attorney, Agent, or Firm*—Flehr, Hohbach, Test, Albritton & Herbert

[57] ABSTRACT

A method and apparatus for detecting the presence of gaseous impurities, notably oxygen, in a gas mixture that flows over an IC wafer in an etcher during the etching process. The method is based upon the discovery that the ratio of the etch rate of spin-on-glass material to the etch rate of other materials, such as plasma-enhanced chemical vapor deposition (PECVD oxide) materials, varies in a predictable manner with the amount of oxygen contaminating the gas mixture. The standard ratio, in the absence of oxygen, is determined for a given set of processing conditions by first etching an SOG wafer, then etching a PECVD oxide material wafer, measuring the amount of material etched in each case, and from that calculating the respective etch rates, and finally taking the ratio of the two calculated etch rates. This standard ratio is used as the benchmark for future tests. When a production run is to be conducted on a new material, the above procedure is repeated when the equipment is otherwise ready for the run, and the new calculated etch rate ratio is compared with the standard ratio. If they are substantially equal, this indicates a lack of oxygen contamination. If the ratio has changed, and other processing conditions have been taken into account (such as RF power and temperature), this indicates the presence of impurities in the gas mixture, and hence probably a leak in the system, or contamination of the gas source itself. In IC manufacturing, the production run is then typically stopped to correct the problem. Calibration data can be generated in advance to determine by how much to adjust the etching time, given a particular measured ratio that is not the same as the standard ratio. The system may be automatically controlled by a computer that calculates the corrected etching time based upon the measured ratio of the respective etch rates of SOG and the PECVD oxide material.

7 Claims, 8 Drawing Sheets

METHOD FOR LEAK DETECTION IN ETCHING CHAMBERS

This invention relates to an apparatus and method for detecting atmospheric leaks in a system for plasma etching films in the manufacture of integrated circuits.

BACKGROUND OF THE INVENTION

In manufacturing an integrated circuit (IC), films of desired semiconducting compounds, various oxides and other materials are plasma etched or deposited on a silicon wafer in layers, with each layer being etched according to a predetermined circuit pattern. The rate of etching varies with, among other things, the type of substance to be etched, the etching temperature, the power and frequency of RF (radio frequency) radiation in the etching chamber, the pressure inside the etching chamber, and the flow rate and composition of the gas that surrounds the wafer during the etching process. To manufacture consistent IC's, it is important to make these factors as consistent as possible. Changes in any of these factors can affect the etching process, including the etch rate, and a given change (such as an increase in temperature or RF power) will typically have similar effects on similar types of films.

A particularly elusive problem involves the leakage of atmospheric gases into the IC manufacturing system. Leaks are difficult to detect directly, but their effects on etching and deposition processes are significant.

When different IC's in a batch end up having different characteristics, such as layers of differing thicknesses, it is important to locate and standardize the factors that have caused the inconsistencies. Factors such as RF power and temperature can be measured directly with accurate instruments, and thus one can directly determine whether such factors are a source of problems.

When an IC is manufactured, a predetermined mixture of gases is flowed through the IC chamber at a given rate. Because of the difficulty in the detecting atmospheric leaks, which as a percentage of the total flow rate may be relatively low, it is difficult to directly identify such leaks as a source of IC inconsistencies. Such leaks can arise in many places in the system: the chamber itself, somewhere in the gas supply lines (such as at valves and connections), at structural defects in the chamber, etc. Gas mixture impurities may also be present in the sources of the gases themselves, even if the system is not leaking to atmosphere.

A system is therefore needed for isolating atmospheric leaks as a source of IC manufacturing problems, and in general for determining whether there are any impurities in a gas mixture used in the etching process.

SUMMARY OF THE INVENTION

A method and apparatus for detecting the presence of leaks in a system for plasma etching films. The apparatus includes an etching system which is preferably computer-controlled, and the method involves first determining the ratio of the etch rate of a spin-on-glass (SOG) film to that of a plasma-enhanced chemical vapor deposition (PECVD) oxide film when no gas contamination is present. At the time of a production run, the ratio is again determined, and if it has changed this indicates the presence of a leak or other source of gas impurity. The equipment must be repaired and/or the gas source replaced to eliminate the impurity.

The method is based upon the newly discovered correlation between the ratio of the etch rate of SOG to the etch rate of PECVD oxide as a function of the concentration of oxygen in the gas. Though these etch rates will be different for different processing conditions, their ratio is substantially constant for a given oxygen concentration. With an increase in the oxygen concentration, the SOG etch rate increases significantly with little corresponding change in the PECVD oxide etch rate. Thus, the presence of an unknown concentration of oxygen can be determined by measuring such etch rates and calculating this ratio, regardless of the other processing conditions.

This calculated effect of the undesired presence of oxygen can then be compensated for by adjusting, for instance, the etching times for materials to be etched. While such compensation is not appropriate for certain high-quality IC components, in other cases it may be appropriate where the effects of the oxygen on the resultant etched material are not important, once the altered etch rate is accounted for. Alternately, as discussed above, detection of the undesired presence of oxygen can be used to determine when repair of the etching chamber is required.

This method for determining the presence and relative effect on etch rate of oxygen contaminating a gas mixture allows the detection of leaks and impurities in a straightforward manner, supplanting more complicated, time-consuming and expensive methods such as gas chromatography or residual gas analysis.

DESCRIPTION OF THE PREFERRED EMBODIMENTS

Figure 1:
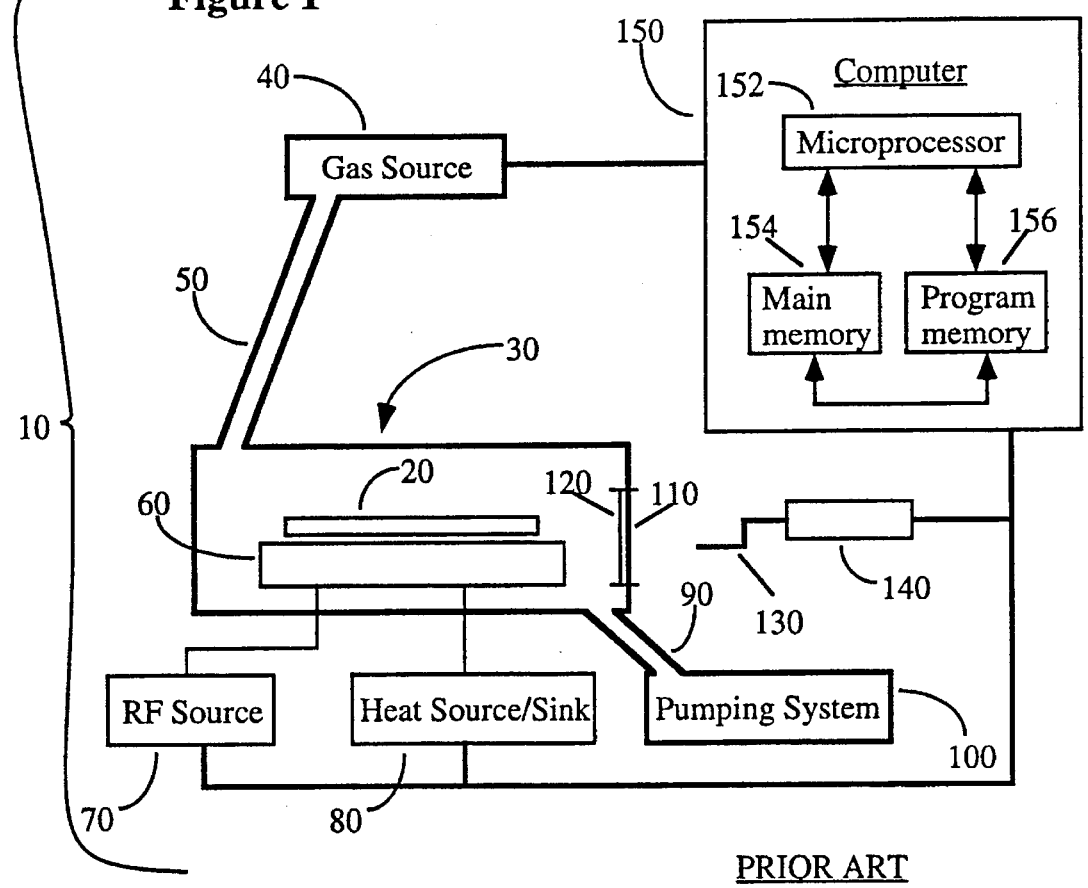
FIGS. 1 and 2 are diagrams of typical IC manufacturing systems.

In the diagram of FIG. 1, an apparatus 10 is shown for the processing of an IC wafer 20. The apparatus may be a conventional etcher such as the RF Triode Etcher Model 650 by GCA (Geophysical Corporation of America), which is used for etching wafers of approximately 125 mm in diameter.

The etcher 10 includes a chamber 30 which is hermetically sealed after a wafer has been placed inside, and is provided with a source 40 of gas flow via a gas line 50. The gas will typically be a $CHF_3$—$CF_4$ mixture, i.e. a mixture of FREON 23 (fluorocarbon 23) and fluorocarbon 14, or a $CHF_3$—$C2F_6$ mixture (fluorocarbon 23 mixed with fluorocarbon 116). These gases are standard in the industry, and others may be used. A typical mixture would be 80–85% $CHF_3$ and 15–20% $CF_4$, assuming for the moment that there are no impurities (such as oxygen) present.

During the etching process, the wafer 20 sits atop a platform 60, which in the reactive ion etch (RIE) mode is coupled to an RF (radio frequency) electromagnetic source 70 and a heat source or sink 80. The sources 70 and 80 provide RF energy and heat to the platform in a conventional manner, to provide the correct conditions for etching of the wafer 20.

Note that source/sink 80 may provide heat to, or alternatively absorb heat from, the platform 60. In the preferred embodiment it is used as a heat sink (i.e., a chiller) to cool the platform 60, i.e. is generally at a lower temperature than the platform. In the following description, it should be realized that either embodiment may be used even where structure 80 is referred to as a heat "source".

The gas flowing through the chamber 30 exits through an exhaust line 90 to a pumping system 100 (which is also used generally to maintain the chamber 30 at a low pressure relative to atmospheric). Thus, the flow of gas is constantly replenished and exhausted from the chamber, at a predetermined flow rate, the rate being selected empirically based upon its known effects upon the etching process. A typical flow rate is 100 standard cubic centimeters per minute (sccm)—the "standard" referring to normalization for room temperature and pressure.

A door 110 is provided into the chamber, and is hermetically sealed by a seal 120 such as an O-ring. (Alternatively, in a GCA etcher, the top half of the chamber lifts off and is re-sealed using an O-ring at the junction between the halves. This is functionally equivalent, and the distinction is not important to the present invention.) In an automated IC etching process, the wafer 20 is automatically inserted into and removed from the chamber 30 by an arm 130 under the control of a robotic controller 140. The robot and the sources 40, 70 and 80, along with the door 110, are all under the control of a conventional computer 150 which includes a microprocessor 152, a main memory 154, and a program memory 156. The program memory 156 stores the program instructions for controlling the apparatus shown in FIGS. 1 and 2 according to the method of the invention. The program for implementing the method of the invention is coded in a standard fashion, and is a routine matter, given the present disclosure.

In a typical etcher, the computer causes the door 110 to open (in FIG. 1), the robotic controller 140 places the wafer 20 onto the platform 60, and the door is then closed. Pumping system 100, also under the control of the computer 150, pumps the pressure in the chamber down to a predetermined level (200 millitorr would be typical). The gas source 40 begins to flow the gas mixture through the chamber 30, and the temperature is brought up to the desired level, normally in the range between −20+ to 25° C., and preferably about 12° C. (though the temperature may in principal be anywhere in the range from about −40° to 100° C.). The gas flowing into the chamber exits into the pumping system 100. The RF source provides a waveform of, for instance, 13.56 MHz at a few hundred Watts (such as 300 W), depending upon the particular RF generator and etcher being used.

After the proper etching time, such as a typical etching time of about sixty seconds, the sources 40, 70 and 80 are shut off, and the door 110 is opened for the removal of the wafer 20. The wafer is subjected to further processing in accordance with standard IC manufacture methods.

Figure 2:
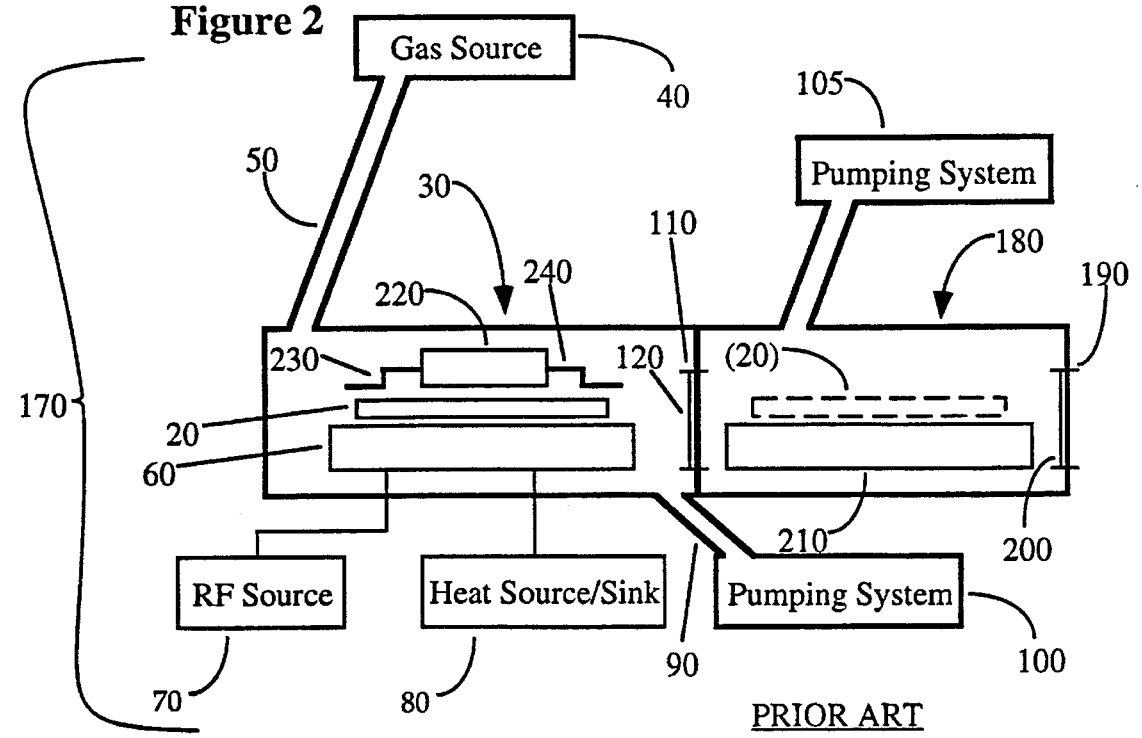

A more sophisticated etcher 170 is shown in FIG. 2, which is in large part identical to the etcher 10 (with like elements being given the same reference numerals), but includes an antechamber 180 which acts as an air lock, and includes its own door 190 with seal 200. This is referred to as a "load-locked" system, while the system of FIG. 1 is a non-load-locked system.

Robotic controller 220 with wafer manipulating arms 230 and 240 is positioned within the chamber 30, and moves the wafer from the outside into the chamber 180 and the chamber 30, and back. Etcher 170 is controlled by a computer such as microprocessor 150 in the same manner as etcher 10, but this is not shown in FIG. 2, for the sake of clarity.

In this embodiment, chamber 30 is evacuated by activating the pumping system 100 while door 110 is closed, and is maintained in an evacuated state even when the system is not in active use. With door 110 closed, door 190 is opened and the wafer is placed on platform 210 (the wafer 20 being indicated in dotted fashion). Door 190 is then closed, and the chamber 180 is then evacuated by pumping system 105 to the correct pressure (preferably substantially matching that of chamber 30). Door 110 is then opened, and the robotic controller 220 moves the wafer 20 into the chamber 30 and onto the platform 60. Heat, RF radiation and gas flow are provided as in the etcher 10 described above, and but for the operation of the air lock 180 and its sealed doors, the processing is the same.

In contrast to etcher 10, etcher 170 provides one extra level of protection of the etching process against the invasion of atmospheric gases, particularly oxygen.

Other types of etchers may be used, such as batch etchers, which can process more than one wafer at a time.

Figure 3:
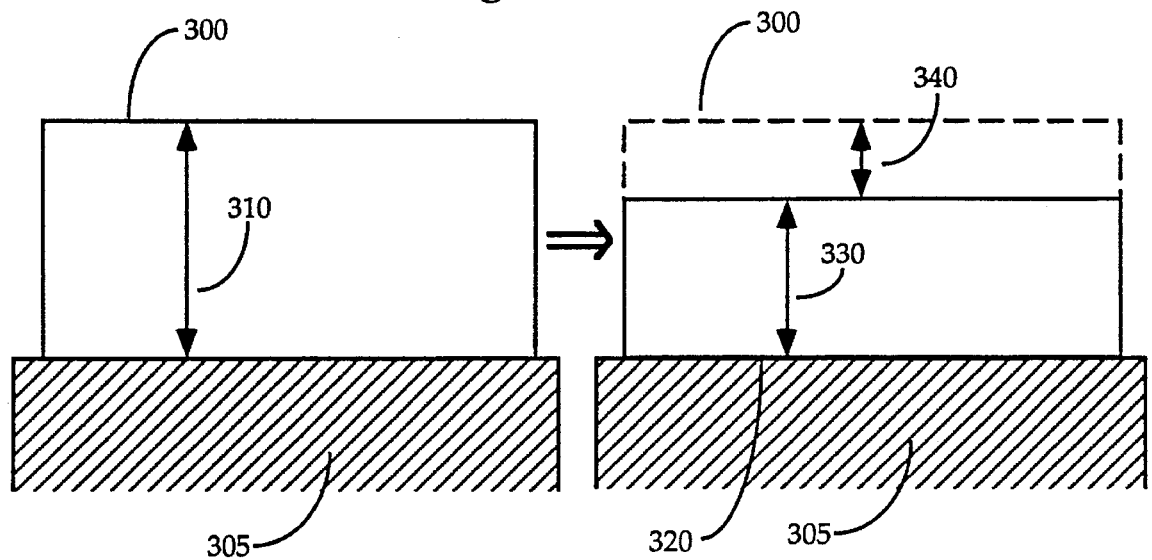
FIG. 3 is a diagram showing the results of etching a spin-on-glass wafer.

When the wafer 20 is removed from either the etcher 10 or the etcher 170, a certain amount of the material of which it is made has been etched away. The rate of etching is important, since the tolerances must be very reliable, and so the process is standardized to the greatest extent possible. FIG. 3 shows a typical effect of etching on a spin-on-glass (SOG) material wafer 300 formed on a conventional substrate 305 (such as silicon). The wafer 300 starts out with a thickness 310 of, for example, 3000 Å. At a typical etch rate of approximately 50 Å per second, 20 seconds of etching should result in the removal of a thickness 340 of about 1000 Å leaving the etched wafer 320 with a thickness 330 of about 2000 Å

Figure 4:
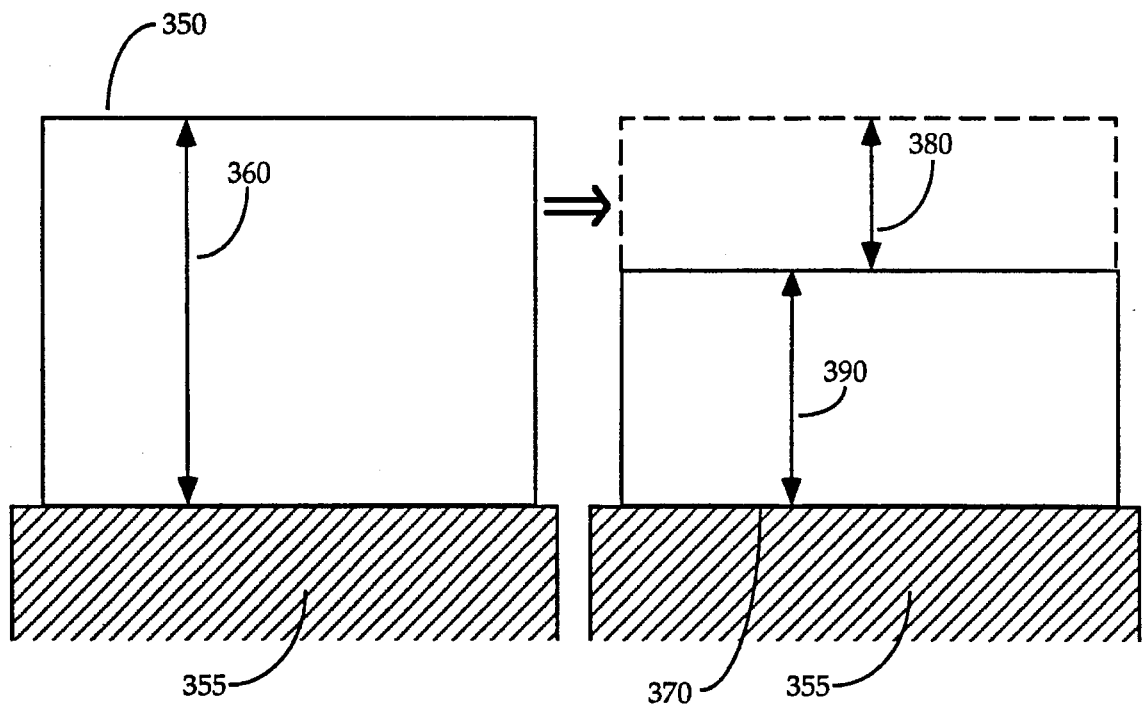
FIG. 4 is a diagram showing the results of etching an oxide wafer.

Different materials will be etched at different rates. A deposited material such as an oxide formed by plasma-enhanced chemical vapor deposition (PECVD oxide) will typically etch at a rate on the order of 100 Å per second, so a 20-second etch will result in a 2000 Å layer being removed. FIG. 4 illustrates this: wafer 350 (on substrate 355) may have an initial thickness of, for example, 5000 Å. It is etched such that the resulting wafer has a thickness 380 of about 2000 Å removed, leaving a thickness 390 of approximately 3000 Å. The etch rate is determined by: etching the wafer in question; measuring the depth of the etching; and dividing this depth by the time of etching. The etched depth or thickness is measured by optical reflectance, such as by using a Nanometrics Corp. "Nanospec 210XP" instrument for measuring thicknesses by optical reflectance. Such an instrument is calibrated in advance for different materials.

Applicant has discovered that, at typical etch rates and identical conditions for the etching of the two wafers, the ratio of the etch rate of SOG to the etch rate of a PECVD oxide is relatively constant, regardless of the processing conditions, except for the presence of oxygen. (Other processing conditions, which have some, much less pronounced, effect on this ratio, include concentration of the etching plasma gases; pressure; concentration of helium; temperature; and helium backside pressure, all of which are discussed below. RF power also has an effect on etching rates.) That is, while changes in the etch rates of each of the materials occurs due to changes in the processing conditions, the net effect on the ratio of the two etch rates is relatively small—except in the case of changing oxygen concentration from 0% (normal) to a nonzero contamination level, which increases the SOG material etch rate significantly while having little effect on the etch rate of the PECVD material. (The etch rate of PECVD oxide or tetraethyl orthosilicate (TEOS) films actually show a slight decrease with the presence of oxygen, evidently due to the dilution of the etchant gases.) Thus, in the case of change in oxygen concentration, the etch rate ratio changes dramatically.

Applicant has also determined that the contamination of the etchant gases with oxygen produces similar effects the etch rate ratio, independently of the other processing factors.

The etch rates for SOG or photoresist, on the one hand, and for PECVD oxide or thermally deposited TEOS material on the other hand, are affected by the variable processing conditions listed above. The effects of changes in these conditions are approximately the same for the SOG and oxide films; for instance, a 10% rise in RF power causes approximately a 10% rise in the etch rates of both SOG and oxide films. Once a set of processing conditions is established, the ratio of etch rates can be predicted, and significant change in the ratio can be ascribed to gaseous impurity, notably oxygen, in the etcher.

FIGS. 6-14 show actual results of tests conducted by applicant on the effects of changes in different variables in the etching procedure, and correspond to the data appearing in Tables 1-8 below (appearing at the end of the specification).

Figure 6:
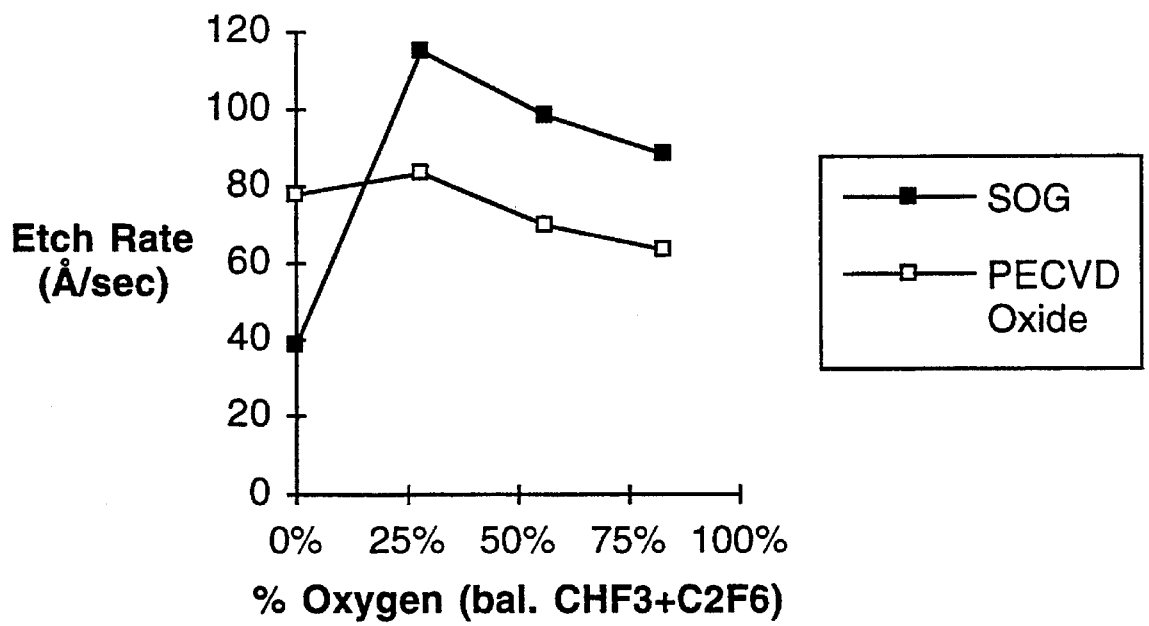
FIGS. 6–14 are graphs showing the effects of different variables on the etch rate ratios in certain materials.

Table 1 and FIG. 6 relate to a test using the following process variables:

Flow rates: 155 sccm $CHF_3$ 55 sccm $C_2F_6$

Pressure: 225 mT

Power: 300 W

Etch time: 60 sec.

With these conditions in an etcher such as that shown in FIG. 1, oxygen was added to the otherwise uncorrupted gas mixture. The first column of Table 1 indicates that the flow rate was varied between 0 sccm and 150 sccm, while the total flow rate of $CHF_6$ and $C_2F_6$ was kept at 180 sccm (as also indicated above; see column 2 of Table 1). Thus, the percent of oxygen in the mixture went from 0% to 83% (see column 3).

For each oxygen level, the etch rates of the SOG and PECVD oxide materials were measured (in Å per second: see columns 4–5). The ratio of these etch rates was taken, and appears in column 6 as "selectivity".

Column 7 in each of the tables shows the average values of the two indicated variable entries in each case; in Table 1, these values are the average oxygen content for each interval between two oxygen content entries (in column 3). The change in etch rate for the SOG material over the same interval appears in column 8, and the change in etch rate for the PECVD oxide material over the interval appears in column 9. Finally, column 10 shows the change in selectivity over the interval, i.e. the change in the ratio of the etch rate of the SOG material to that of the PECVD material.

Figure 14:
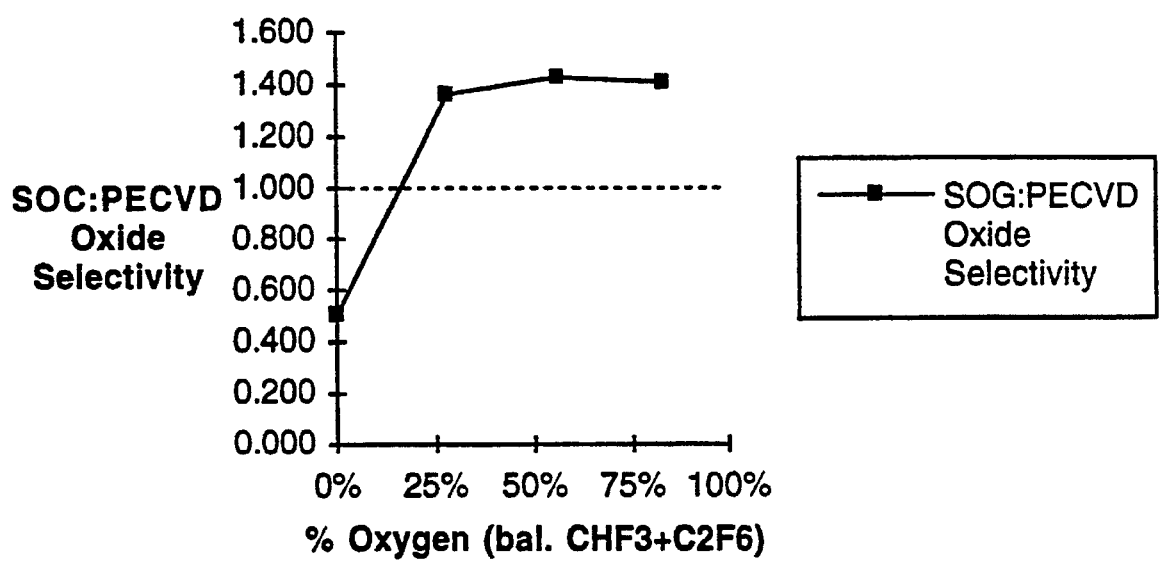

Table 1 shows that with 0% oxygen in the mixture, the ratio of the etch rate of SOG to that of the PECVD oxide was 0.505. At 28% oxygen, the etch rate ratio climbed to 1.361, for a change of 169% in the selectivity value. After that, additional increases in the oxygen concentration led to only small changes in selectivity, which remained at about 1.4. These results appear graphically in FIG. 6, which shows the actual etch rates of the SOG material and the PECVD oxide material for the different oxygen concentrations. FIG. 14 is a graph of the selectivity, i.e. ratio of the two etch rates, which shows a very large increase between 0% and 28% (from 0.505 to 1.361, the 169% increase mentioned above), and then a relatively constant value after that.

Figure 7:
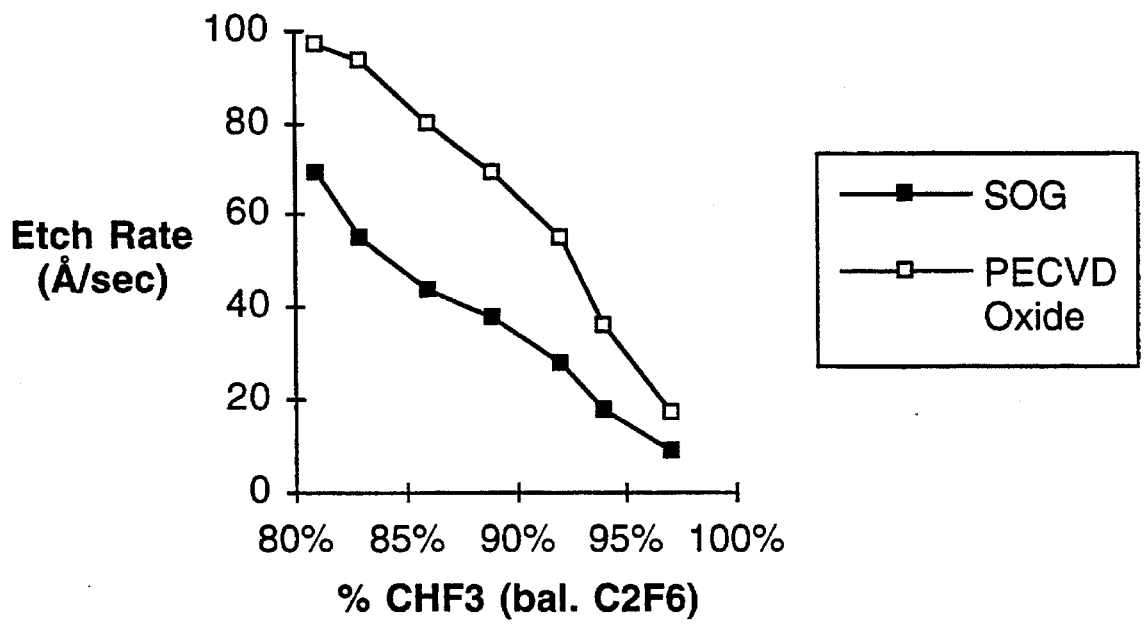

Table 2 lists resulting etch rates with all processing conditions held constant except the ratio of the $CHF_3$ to $C_2F_6$ flow rates; while the total flow rate remained at 180 sccm, the ratio of the concentration of $CHF_3$ varied from about 81% to 97%. Over this range, the selectivity changed very little, varying from 0.708 to 0.502. Corresponding FIG. 7 shows that, while the etch rates of the SOG and PECVD materials did change with the variations in the gas concentrations, the etch rate changes track one another, thus keeping the selectivity relatively constant (mostly between 0.502 and 0.585).

Figure 8:
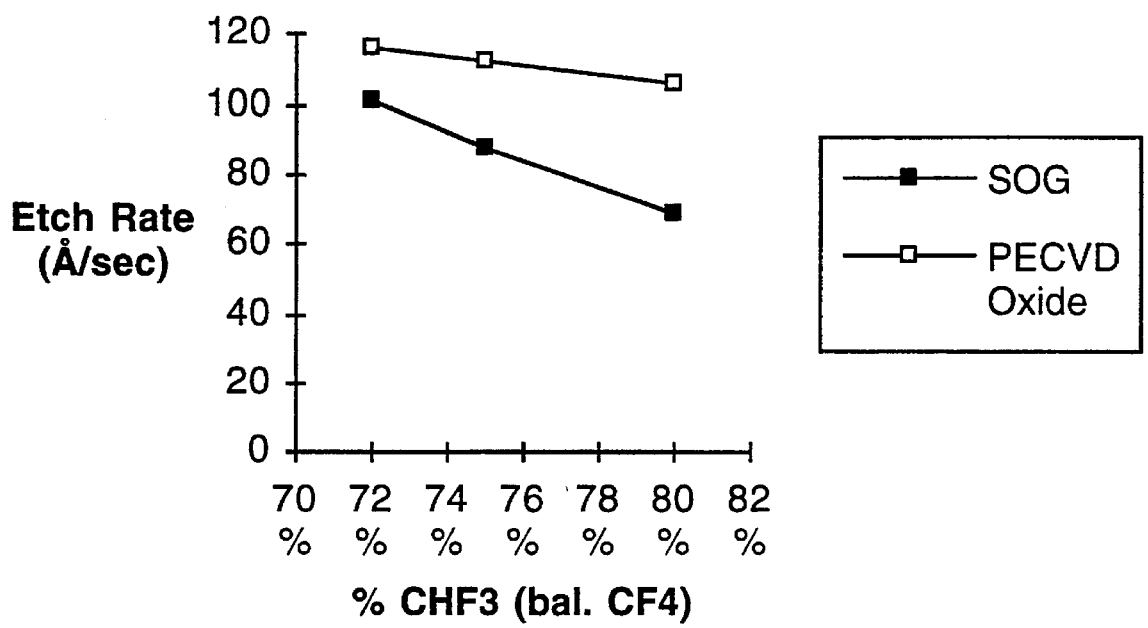

This pattern appears in the other tables and corresponding figures, as well. Table 3 and FIG. 8 show the changes in the selectivity in etching SOG and PECVD oxide wafers using $CF_4$ and $CHF_3$, where again the gas concentrations were altered for the test. Here, the selectivity varied between 0.651 and 0.871.

Figure 9:
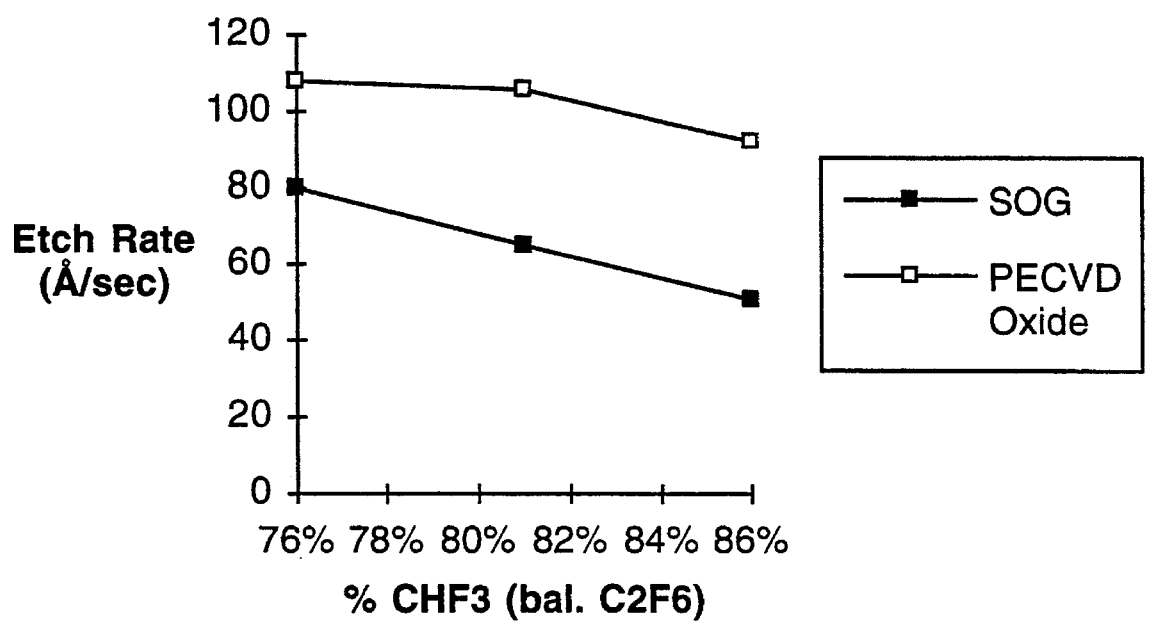
Figure 10:
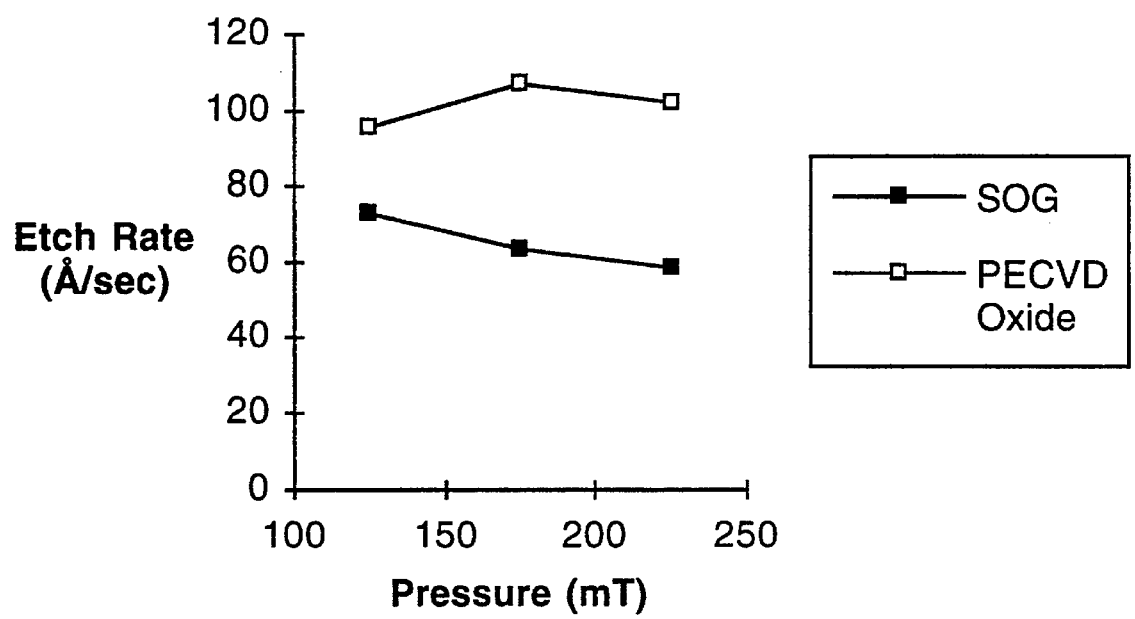
Figure 11:
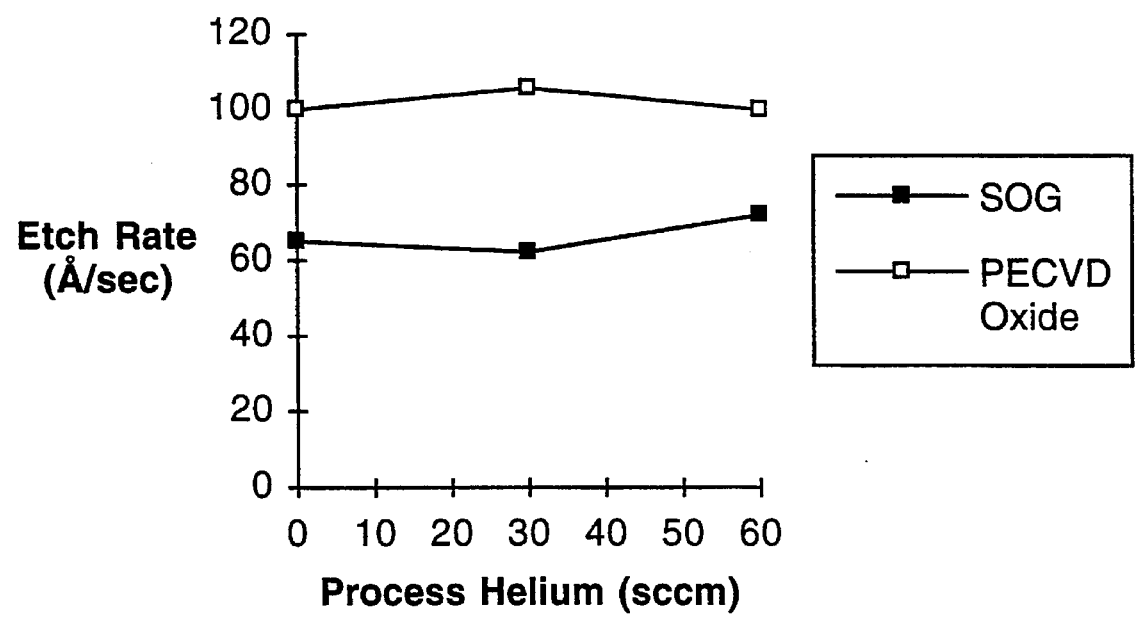

Table 4 and FIG. 9 show similar results for changes in gas concentration of $CHF_3$, with the remainder of the mixture being $C_2F_6$. The resultant selectivity varied from 0.556 to 0.744. Table 5 and FIG. 10 show the results from a similar setup, except that the pressure of the gas was varied between 125 and 175 mT, resultant in a variance in the selectivity between 0.576 and 0.762. Table 6 and FIG. 11 are also similar, this time varying the helium pressure between 0 and 60 sccm, with resultant selectivities between 0.581 and 0.715.

Figure 12:
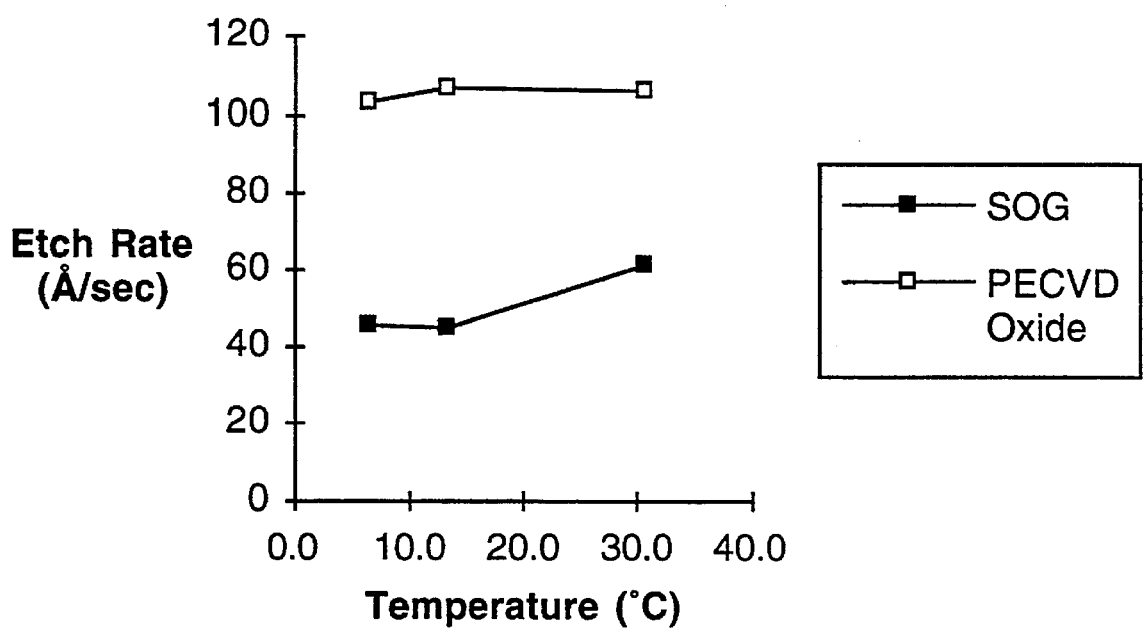

Tables 7 and 8 reflect results of tests conducted with a gas mixture of 86% $CHF_3$ and the remainder $C_2F_6$. Table 7 and FIG. 12 show the response of selectivity to variations in processing temperature between 6.4° and 30.6° C.; the selectivity varies only between 0.445 and 0.577. (The temperatures measured here are the temperatures of the platform upon which the wafer is placed; the actual temperature of the wafer is difficult to measure.)

Figure 13:
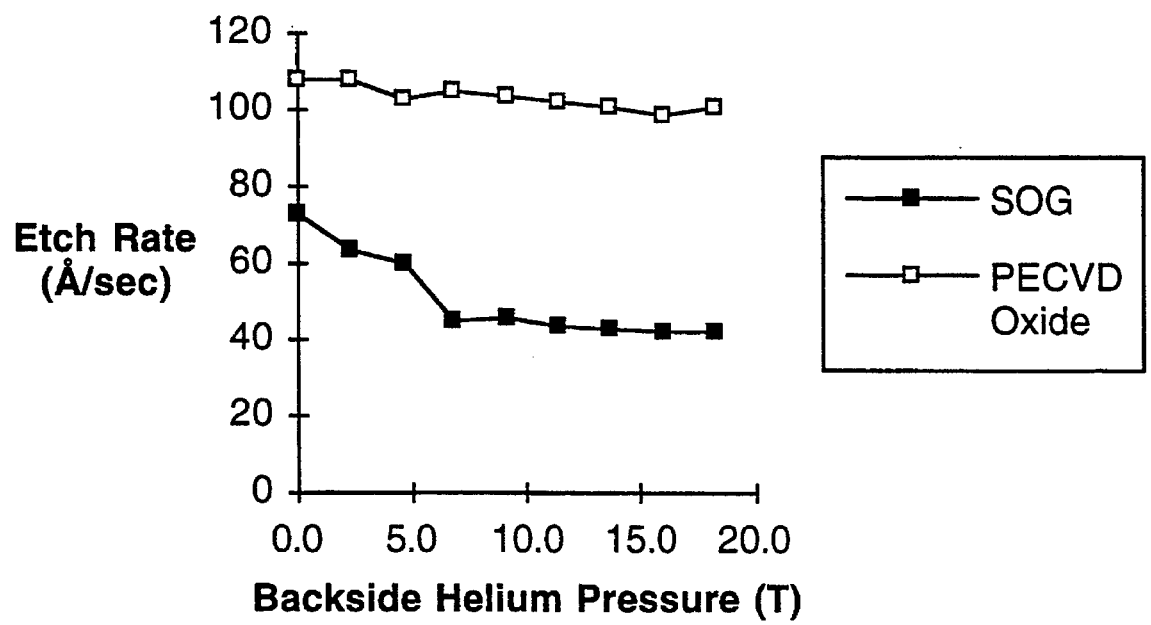

Finally, Table 8 and FIG. 13 show the effect of helium backside pressure changes on the selectivity value. With the backside pressure varying between 0 and 18.3 T, the selectivity varied only between 0.427 and 0.682.

Those skilled in the art will recognize that the helium backside pressure is related to the temperature of the wafer, with higher pressures contributing to greater heat exchange between the wafer and the platform, tending to balance out heating effects in the chamber, such as: heat energy from the etching plasma; exothermic chemical reactions in the chamber; and the fact that convection and conduction heat transfer from the wafer to the platform are not very high because of the near-vacuum in the chamber. Thus, the wafer may be clamped to the platform to improved conductive heat transfer, and the helium backside pressure is introduced at the back of the wafer, also to increase heat transfer. A helium backside pressure of approximately 5–10 T brings the wafer temperature reasonably close to the platform temperature.

Inspection of all of the experimental results of Tables 1–8 and FIGS. 6–14 shows that no processing factor tested results in a selectivity outside the range of 0.419 to 0.871, except the presence of oxygen in the chamber, which quickly brings the selectivity up to about 1.4, for a percent change in selectivity of 169%, far greater than for any of the other factors. Thus, a measurement of the selectivity is a very good indicator of the presence of oxygen in the gas mixture, which in turn is an indicator of the existence of a leak in the system. This is especially so since changes in such factors temperature and RF power can be independently detected by conventional equipment, and thus eliminated as possible factors undesirably affecting the etch rates. Thus, the etch rates and the ratio of etch rates can in effect be calibrated and normalized once the RF and temperature variations are measured, and remaining significant variations can be ascribed to oxygen impurities.

It is important to note that the absolute values of the selectivity are not as important as the variance from an initially established "normal" value, which is determined for a given set of processing conditions where the operator has carefully taken steps to ensure that there is no oxygen contamination of the etching gases. This "normal" value for the conditions discussed above for Tables 1–8 centers at about 0.5. For other processing conditions, it may be different; inspecting for large changes in the selectivity will still reveal whether oxygen contamination is present in the gas mixture. For instance, following are applicant's current preferred processing conditions, for which the above values will be somewhat different:

Flow rate: 181 sccm $CHF_3$ 39 sccm $CF_4$

Pressure: 175 mT

Power: 375 W

Etch time: 64 sec.

The selectivity value alone can be used to determine the presence and concentration of $O_2$, where other variables are held constant. The selectivity value in conjunction with consideration of the actual etching rates can be used to determine the presence of a leak, particularly where other factors (such as temperature) are eliminated as sources for etch rate changes.

Where, for instance, the SOG etch rate increases while the PECVD etch rate remains about the same, then a concomitant increase in selectivity is likely caused either by a change in temperature (which can result from changes in the wafer chiller temperature or the helium backpressure) or an oxygen leak. Eliminating the temperature as a factor (by taking temperature measurements) leads to the conclusion that there is an oxygen leak.

There are possible variations on processing the SOG and PECVD oxide wafers, such as placing them in the etcher at the same time (using a batch etcher), which would ensure that the processing conditions were the same for the two wafers. However, a factor that would not be standardized with this approach is the differences in local conditions at different positions within the etching chamber. The RF power, temperature and gas flow conditions may change noticeably with a small change in position within the chamber. Therefore, although these changes may in principle be measured and taken into account, experience shows that for a small etching chamber or where chamber conditions are not homogeneous, it is preferable to etch the two test wafers at different times, while taking care to ensure that the controllable processing conditions are as nearly identical as possible.

Figure 5:
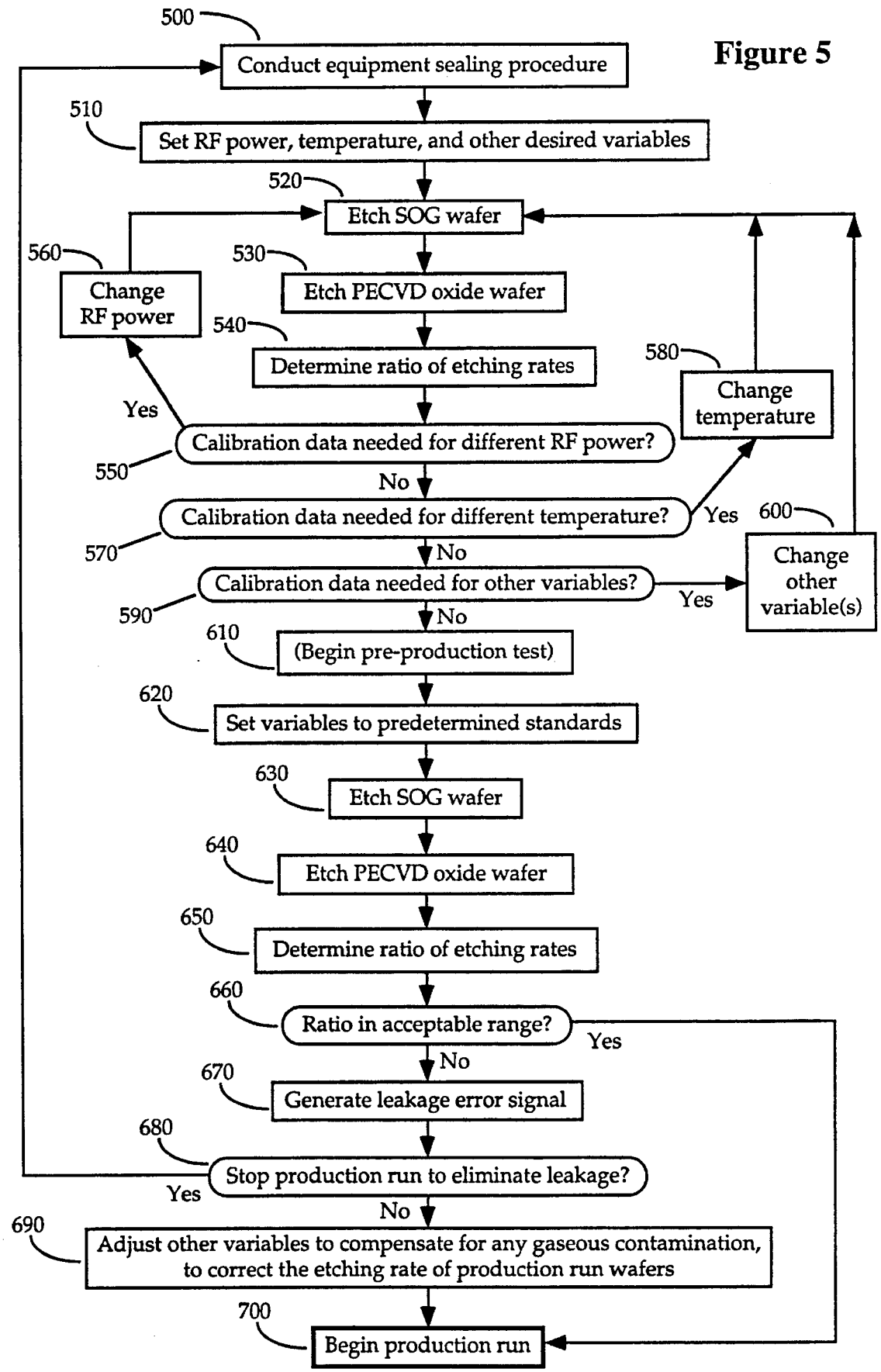
FIG. 5 is a flow chart depicting the overall method of the invention.

The overall method for wafer etching with leak detection for the etcher is depicted in the flow chart of FIG. 5. Initially, at step 500, the equipment is sealed, checking as well as possible for any possible air leaks. At this initial stage, strenuous leak detection tests are performed, such as by evacuating the equipment to a known low pressure, and measuring pressure change over time. These are not steps that would normally be taken during a production run, but for the calibration steps extra care should be taken to ensure that there are no air leaks. Once this is done in an exacting manner for the first calibration run, subsequent testing according to the invention can be relied upon to detect changes due to atmospheric contamination of the gas.

Two wafers are prepared as in FIGS. 3 and 4, and their thicknesses are measured using conventional methods. One wafer is like wafer 300, namely of an SOG material, while the other (wafer 350) is a PECVD oxide film (or a similar film such as TEOS oxide or thermal oxide).

At step 510, the processing conditions are set as described above, and then at steps 520 and 530 the two wafers are etched. Wafer 300 (see FIG. 3) is etched for 20 seconds at standard conditions, and its thickness is again measured. Wafer 350 is also etched for a period of time such as 20 seconds, and the resulting thickness is measured. The etch rate for each wafer is determined by dividing the removed thickness by the actual time of etching. The ratio is then taken of the SOG etch rate to the PECVD oxide material etch rate. This is the selectivity value that is used from then on as the standard.

At step 550, the user may wish to obtain further calibration data to determine the effects of different RF power on the selectivity, and if so proceeds to step 560 to repeat steps 520–540 for two new wafers. This may be done as often as desired, to build up an empirical table of etch rate versus RF power.

The same may be done for different temperatures (steps 570–580) and for other processing variables (steps 590–600), as desired by the user. In a typical production run, though, these variables will be held constant and steps 550, 570 and 590 will all be negative, proceeding straight through to step 610, where the pre-production test is begun.

At step 620, the processing conditions are set up according to those for which calibration data Were determined in steps 520–540. An SOG wafer is etched (step 630) and then a PECVD oxide material wafer is etched (step 640). The ratio of their etch rates, i.e. selectivity, is determined at step 650. If the selectivity is in the appropriate range, then the actual production run can be carried out (step 700) for all the desired wafers without further adjustments.

However, if the selectivity is out of the appropriate range, this indicates gaseous impurities, so that a decision must be made to repair the equipment or to proceed with the production run. Normally, one will wish to stop the leakage, and therefore at step 670 the control software will typically generate an error signal that notifies the technician operating the etcher that (A) the etcher requires repair, and/or (B) the gas supply is contaminated with oxygen. In addition, the system preferably outputs a signal indicating the percentage of oxygen in the gas, which is based upon predetermined calibration data.

Once the leak is repaired or the gas supply is replaced, the etcher will typically need to be retested; for this, the production run is stopped at step 680, and the method proceeds back to step 500, whereafter new calibration data will be obtained. Thus, prior to an actual production run of high-quality IC's, the answer provided to the test at step 680 will be affirmative.

Since the presence of a gas impurity in the system can affect the resultant etched material in undesirable and unpredictable ways, usually the user will fix a detected leak before proceeding with production. There may be circumstances, however, where the thickness of the resulting wafer is of primary importance, and other affected characteristics can be ignored. In this case, it is possible for the user to proceed using the etch rates for different levels of gas impurities as determined by graphs such as those shown in Tables 1–8 and FIGS. 6–14. The data of these tables can be used as a set of calibration selectivities, such that from a given, measured etch rate ratio one can read from the x-axis the amount of impurity in the system at the time of etching.

Thus, for the production of wafers that can tolerate the presence of oxygen, which generally will not be the highest quality wafers or will be of materials where the effect of oxygen on the etching process is not deleterious, the etch time and other variables are corrected at step 690. The method then proceeds to step 700 to go on with the production run.

Calibration selectivities for such flexible production runs may be obtained for a variety of materials, and the proper etching times may be estimated based upon the level of gas impurity calculated for the chamber, which is obtained from the actual measured ratio of the etch rates of the SOG wafer and PECVD oxide wafer.

Automating the etching method.

The procedure may be automated by providing a control program stored in the computer 150 to control the etching process. The calibration data (the original etch rates) are stored in a memory (not separately shown) in the computer. When the etch rates of the pre-production run SOG and PECVD oxide wafers are determined, these are also stored, and the etch rate ratio is calculated and stored. The programming required to carry out these steps is straightforward, and the resultant instructions are stored in the program memory 156 shown in FIG. 1, as discussed above, or in the corresponding computer memory for controlling the apparatus of FIG. 2.

When a user is conducting a production run, he or she specifies the desired etch time, or specifies the material which is to be etched and other factors as desired, and the computer may determine the etch time from a predetermined table in its memory. In either case, the control program adjusts the actual etch time to compensate for any gaseous impurities detected at steps 640–660. Since the calibration data is already available, it is not a difficult matter to interpolate from graphs such as those of FIGS. 8–14—or their equivalent in a database—and reset the etch time for the production run materials so that resulting etched amount of material will be just that desired by the user.

When such a control program is used, the user need only provide the data to the computer of the actual etched thicknesses of the wafers; the program then calculates the etch rates and ratios, using the known etching time. With proper robotics, the entire flow chart of FIG. 5 can in fact be automated, with the user only physically providing the wafers to the robotic controller and providing the answers at decision boxes 550, 570, 590 and 670 (and even these can be preprogrammed). The acceptable range of box 660 is predetermined by the user, and may be, for instance, 0.52±0.03 (or approximately ±4%), where 0.52 is the calibrated selectivity from step 540.

If the When the selectivity goes from, for example, 0.52 to 0.56 (with a tolerance of ±0.3), then the computer should automatically shut down the system until the problem can be determined. A very large oxygen leak will reveal itself as a large selectivity change. A smaller selectivity change (such as the change of ±0.4 in this example) may be due to other factors, and these must be considered before one can be certain that oxygen leakage is the problem. Still, the selectivity alteration is a first alert to the presence of a leak, and in a broader sense is an alert to some problem in the system.

Automated film thickness measuring tools can also be integrated into the system of the invention, so that the thickness measurements may be made without an operator being involved. For measurements outside the acceptable range of selectivity, the control program should be configured to halt processing, notify the operator, and, optimally, perform a series of automated, conventional tests on the equipment to attempt to isolate the inferred leak. Thus, the new system of the invention provides a methodology that enables full automation of the process, for more reliable results, providing heretofore unavailable leak detection, and reducing human involvement, slower manual steps, and overall costs.

Following are the tables discussed above:

TABLE 1

(FIGS. 6 and 14)

| | | | | |
|---|---|---|---|---|
| $O_2$ (sccm) | 0 | 50 | 100 | 150 |
| $CHF_3 + C_2F_6$ (sccm) | 180 | 180 | 180 | 180 |
| Percent $O_2$ | 0% | 28% | 56% | 83% |
| SOG etch rate (Å/sec) | 39 | 115 | 99 | 89 |
| PECVD Oxide etch rate (Å/sec) | 78 | 84 | 70 | 64 |
| SOG: PECVD Oxide Selectivity | 0.505 | 1.361 | 1.428 | 1.405 |
| Average Percent $O_2$ | | 14% | 42% | 69% |
| Change in etch rate (%): | | | | |
| SOG | | 75 | −15 | −10 |
| PECVD Oxide | | 7 | −15 | −6 |
| Change in Selectivity (Percent) | | 169% | 5% | −2% |

TABLE 2

(FIG. 7)

| | | | | | | | |
|---|---|---|---|---|---|---|---|
| $CHF_3$ (sccm) | 145 | 150 | 155 | 160 | 165 | 170 | 175 |
| $C_2F_6$ (sccm) | 35 | 30 | 25 | 20 | 15 | 10 | 5 |
| Percent $CHF_3$ | 81% | 83% | 86% | 89% | 92% | 94% | 97% |
| SOG etch rate (Å/sec) | 69 | 55 | 44 | 38 | 28 | 18 | 9 |
| PECVD Oxide etch rate (Å/sec) | 97 | 93 | 80 | 69 | 55 | 36 | 17 |
| SOG: PECVD Oxide Selectivity | 0.708 | 0.585 | 0.551 | 0.543 | 0.518 | 0.502 | 0.516 |
| Average Percent $CHF_3$ | | 82% | 85% | 88% | 90% | 93% | 96% |
| Change in etch rate (%): | | | | | | | |
| SOG | | −14 | −10 | −7 | −9 | −10 | −9 |
| PECVD Oxide | | −4 | −13 | −11 | −15 | −19 | −19 |
| Change in Selectivity (Percent) | | −17% | −6% | −2% | −5% | −3% | 3% |

TABLE 3

(FIG. 8)

| | | | |
|---|---|---|---|
| CHF₃ (sccm) | 177 | 166 | 158 |
| CF₄ (sccm) | 43 | 54 | 62 |
| Percent CHF₃ | 80% | 75% | 72% |
| SOG etch rate (Å/sec) | 69 | 88 | 101 |
| PECVD Oxide etch rate (Å/sec) | 106 | 112 | 116 |
| SOG: PECVD Oxide Selectivity | 0.651 | 0.786 | 0.871 |
| Average Percent CHF₃ | | 78%  74% | |

Change in etch rate (%)

| | | |
|---|---|---|
| SOG | 19 | 13 |
| PECVD Oxide | 6 | 4 |
| Change in Selectivity (Percent) | 21% | 11% |

TABLE 4

(FIG. 9)

| | | | |
|---|---|---|---|
| Percent CHF₃ | 76% | 81% | 86% |
| Pressure (mT) | 175 | 175 | 175 |
| Process Helium (sccm) | 30 | 30 | 30 |
| SOG etch rate (Å/sec) | 80 | 65 | 51 |
| PECVD Oxide etch rate (Å/sec) | 108 | 106 | 92 |
| SOG: PECVD Oxide Selectivity | 0.744 | 0.606 | 0.556 |
| Average Percent CHF₃ | | 79%  84% | |

Change in etch rate (%)

| | | |
|---|---|---|
| SOG | −16 | −14 |
| PECVD Oxide | −1 | −15 |
| Change in Selectivity (Percent) | −19% | −8% |

TABLE 5

(FIG. 10)

| | | | |
|---|---|---|---|
| Percent CHF₃ | 81% | 81% | 81% |
| Pressure (mT) | 125 | 175 | 225 |
| Process Helium (sccm) | 30 | 30 | 30 |
| SOG etch rate (Å/sec) | 73 | 64 | 59 |
| PECVD Oxide etch rate (Å/sec) | 96 | 107 | 102 |
| SOG: PECVD Oxide Selectivity | 0.762 | 0.599 | 0.576 |

TABLE 5-continued (FIG. 10)

| | | |
|---|---|---|
| Pressure (mT) | 150 | 200 |

Change in etch rate (%)

| | | |
|---|---|---|
| SOG | −9 | −5 |
| PECVD Oxide | −11 | −5 |
| Change in Selectivity (Percent) | −21% | −4% |

TABLE 6

(FIG. 11)

| | | | |
|---|---|---|---|
| Percent CHF₃ | 81% | 81% | 81% |
| Pressure (mT) | 175 | 175 | 175 |
| Process Helium (sccm) | 0 | 30 | 60 |
| SOG etch rate (Å/sec) | 65 | 62 | 72 |
| PECVD Oxide etch rate (Å/sec) | 100 | 106 | 100 |
| SOG: PECVD Oxide Selectivity | 0.651 | 0.581 | 0.715 |
| Helium (sccm) | | 15  45 | |

Change in etch rate (%)

| | | |
|---|---|---|
| SOG | −4 | 10 |
| PECVD Oxide | 6 | −6 |
| Change in Selectivity (Percent) | −11% | 23% |

TABLE 7

(FIG. 12)

| | | | |
|---|---|---|---|
| Temperature (°C.) | 6.4 | 13.2 | 30.6 |
| SOG etch rate (Å/sec) | 46 | 45 | 61 |
| PECVD Oxide etch rate (Å/sec) | 103 | 107 | 106 |
| SOG: PECVD Oxide Selectivity | 0.445 | 0.418 | 0.577 |
| Average Temperature (°C.) | | 10  22 | |

Change in etch rate (%)

| | | |
|---|---|---|
| SOG | −1 | 17 |
| PECVD Oxide | 4 | 0 |
| Change in Selectivity (Percent) | −6% | 38% |

TABLE 8

(FIG. 13)

| | | | | | | | | |
|---|---|---|---|---|---|---|---|---|
| Backside He Pressure (T) | 0.0 | 2.3 | 4.6 | 6.8 | 9.1 | 11.4 | 13.7 | 16.0 | 18.3 |
| SOG etch rate (Å/sec) | 73 | 64 | 60 | 45 | 46 | 44 | 43 | 42 | 42 |
| PECVD Oxide etch rate (Å/sec): | 108 | 108 | 103 | 105 | 104 | 102 | 101 | 99 | 101 |
| SOG:PECVD Oxide Selectivity | 0.682 | 0.590 | 0.582 | 0.433 | 0.437 | 0.428 | 0.427 | 0.429 | 0.419 |
| Average Backside He Pressure | 1 | 3 | 6 | 8 | 10 | 13 | 15 | 17 | |

Change in etch rate (%)

| | | | | | | | | |
|---|---|---|---|---|---|---|---|---|
| SOG | −10 | −4 | −15 | 0 | −2 | −1 | −1 | 0 |
| PECVD Oxide | 1 | −5 | 2 | −1 | −2 | −1 | −2 | 2 |
| Change in Selectivity (Percent) | −14% | −1% | −26% | 1% | −2% | 0% | 1% | −2% |

What is claimed is:

1. A method for detecting the presence of oxygen contamination in an etching system, including the steps of:

(1) forming a first wafer of spin-on-glass (SOG) material;

(2) forming a second wafer of plasma-enhanced chemical vapor deposition (PECVD) oxide material;

(3) etching the first wafer at predetermined processing conditions for a first time period;

(4) determining a first rate of etching based upon a first thickness of the first wafer etched over said first time period;

(5) etching the second wafer at said predetermined processing conditions for a second time period;

(6) determining a second rate of etching based upon a second thickness of the second wafer etched over said second time period;

(7) determining a test ratio of said first rate of etching to said second rate of etching;

(8) comparing said test ratio with a predetermined calibration ratio of a rate of etching of said SOG material to said PECVD oxide material; and (9) generating an error signal when said test ratio is outside a predetermined range relative to said calibration ratio.

2. The method of claim 1, wherein the predetermined range is no greater than 4% of said predetermined calibration ratio.

3. A method for detecting the presence of a gas impurity in a system for etching materials of predetermined types, the system including a subsystem for providing a flow of a predetermined gas mixture past the materials during the etching process, the predetermined gas mixture including one or more gases and substantially excluding a predetermined impurity, where a ratio of the etch rate of a first type of material to the etch rate of a second type of material is different for different amounts of the predetermined impurity in the predetermined gas mixture, the method including the steps of:

(1) etching a first piece of a first type of material for a first length of time in the presence of the predetermined gas mixture and the absence of the predetermined impurity;

(2) measuring a first thickness of the first type of material etched in step 1;

(3) determining a first etch rate for the first type of material from the first length of time and the first thickness of material etched;

(4) etching a second piece of a second type of material for a second length of time in the presence of the gas mixture and the absence of the predetermined impurity;

(5) measuring a second thickness of the second type of material etched in step 4;

(6) determining a second etch rate for the second type of material from the second length of time and the second thickness of material etched;

(7) determining a first etch rate ratio of the first etch rate to the second etch rate;

(8) repeating steps 1–3, for a third piece of the first type of material, and repeating steps 4–6 for a fourth piece of the second type of material, to determine a third etch rate for the third piece of material and a fourth etch rate for the fourth piece of material;

(9) determining a second etch rate ratio of the third etch rate to the fourth etch rate;

(10) comparing the second etch ratio with the first etch ratio; and

(11) generating a signal indicative of the presence of said predetermined impurity in the system when the second etch ration is outside a predetermined range relative to said first etch ratio.

4. The method of claim 3, further including the steps of:

repeating steps 1–3 and 4–6 with successive pieces of the first and second material, respectively, with different amounts of the predetermined impurity present in the system at each repetition, and repeating step 7 so as to generate a distinct calibration etch rate ratio for each said amount of the predetermined impurity present, thereby generating a set of calibration etch rate ratios for the first and second materials correlated with amounts of the impurity.

5. The method of claim 4, further including the steps of:

determining a desired etching time for etching a production piece of material, the desired etching time based upon said first etch rate determine in step 3;

determining an impurity content ratio of said second etch rate ratio to said first etch rate ratio.

6. The method of claim 5, further including the step of:

if said impurity content ratio is other than substantially 1:1, adjusting the desired etching time for a fifth piece of material, based upon said impurity content ratio, to compensate for the presence of the impurity.

7. The method of claim 5, further including the steps of:

if said impurity content ratio is other than substantially 1:1, determining from said set of calibration etch rate ratios the amount of the impurity present in the system; and generating an output indicating said amount of the impurity present.

* * * * *